US009374106B2

(12) United States Patent
Agarwal et al.

(10) Patent No.: US 9,374,106 B2
(45) Date of Patent: Jun. 21, 2016

(54) EFFICIENT CONTEXT SAVE/RESTORE DURING HARDWARE DECOMPRESSION OF DEFLATE ENCODED DATA

(71) Applicant: International Business Machines Corporation, Armonk, NY (US)

(72) Inventors: Kanak B. Agarwal, Austin, TX (US); Damir A. Jamsek, Austin, TX (US); Andrew K. Martin, Austin, TX (US); Reiner Rieke, Althengstett (DE); Joerg-Stephan Vogt, Holzgerlingen (DE); Gunnar von Boehn, Sulz am Neckar (DE)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 14/012,382

(22) Filed: Aug. 28, 2013

(65) Prior Publication Data

US 2015/0066878 A1 Mar. 5, 2015

(51) Int. Cl.
*G06F 17/30* (2006.01)
*H03M 7/40* (2006.01)
*H03M 7/30* (2006.01)

(52) U.S. Cl.
CPC .......... *H03M 7/40* (2013.01); *G06F 17/30153* (2013.01); *G06F 17/30598* (2013.01); *H03M 7/3086* (2013.01)

(58) Field of Classification Search
None
See application file for complete search history.

(56) References Cited

U.S. PATENT DOCUMENTS

| 5,051,745 | A | | 9/1991 | Katz |
| 5,155,484 | A | * | 10/1992 | Chambers, IV ..... G06F 12/0802 341/106 |
| 5,440,753 | A | | 8/1995 | Hou et al. |
| 5,461,679 | A | | 10/1995 | Normile et al. |
| 5,506,580 | A | | 4/1996 | Whiting et al. |
| 5,890,006 | A | | 3/1999 | Tran et al. |
| 5,963,154 | A | | 10/1999 | Wise et al. |
| 6,061,775 | A | | 5/2000 | Tran et al. |
| 6,215,424 | B1 | | 4/2001 | Cooper |
| 6,219,457 | B1 | | 4/2001 | Potu |

(Continued)

FOREIGN PATENT DOCUMENTS

| EP | 0877320 | 4/1998 |
| EP | 0891089 | 1/1999 |
| WO | 2009134932 | 11/2009 |

OTHER PUBLICATIONS

Office Action for U.S. Appl. No. 13/313,072, U.S. Patent and Trademark Office, mailed May 13, 2013, 16 pages.

(Continued)

*Primary Examiner* — Son T Hoang
(74) *Attorney, Agent, or Firm* — VanLeeuwen & VanLeeuwen; William J. Stock

(57) ABSTRACT

A hardware accelerator receives a request to decompress a data stream that includes multiple deflate blocks and multiple deflate elements compressed according to block-specific compression configuration information. The hardware accelerator identifies a commit point that is based upon an interruption of a first decompression session of the data stream and corresponds to one of the deflate blocks. As such, the hardware accelerator configures a decompression engine based upon the corresponding deflate block's configuration information and, in turn, recommences decompression of the data stream at an input bit location corresponding to the commit point.

14 Claims, 11 Drawing Sheets

(56) References Cited

U.S. PATENT DOCUMENTS

| | | | |
|---|---|---|---|
| 6,310,563 B1 | 10/2001 | Har et al. | |
| 6,489,902 B2 | 12/2002 | Heath | |
| 6,657,565 B2 | 12/2003 | Kampf | |
| 6,693,567 B2 | 2/2004 | Cockburn et al. | |
| 6,732,198 B1 | 5/2004 | Johnson et al. | |
| 6,781,529 B1* | 8/2004 | Lin | H03M 7/42 |
| | | | 341/106 |
| 6,822,589 B1 | 11/2004 | Dye et al. | |
| 6,865,668 B1 | 3/2005 | Benes et al. | |
| 6,944,751 B2 | 9/2005 | Fetzer et al. | |
| 7,180,433 B1 | 2/2007 | Grotmol | |
| 7,233,265 B2 | 6/2007 | Cockburn et al. | |
| 7,305,542 B2 | 12/2007 | Madduri | |
| 7,439,883 B1 | 10/2008 | Moni et al. | |
| 7,453,377 B2 | 11/2008 | Lee et al. | |
| 7,492,290 B1 | 2/2009 | Schneider | |
| 7,500,103 B2 | 3/2009 | Cockburn et al. | |
| 7,640,417 B2 | 12/2009 | Madduri | |
| 7,681,013 B1 | 3/2010 | Trivedi et al. | |
| 7,817,069 B2 | 10/2010 | Schneider | |
| 7,872,598 B2 | 1/2011 | Baktir et al. | |
| 8,013,762 B2 | 9/2011 | Matthews et al. | |
| 8,125,357 B1 | 2/2012 | Hamlet et al. | |
| 8,244,911 B2 | 8/2012 | Bass et al. | |
| 8,325,069 B2 | 12/2012 | Gopal et al. | |
| 2003/0091242 A1 | 5/2003 | Kakarala et al. | |
| 2003/0163672 A1 | 8/2003 | Fetzer et al. | |
| 2003/0185305 A1 | 10/2003 | Macinnis et al. | |
| 2003/0236964 A1 | 12/2003 | Madduri | |
| 2004/0028141 A1 | 2/2004 | Hsiun et al. | |
| 2004/0116143 A1 | 6/2004 | Love et al. | |
| 2004/0120404 A1 | 6/2004 | Sugahara et al. | |
| 2004/0221143 A1 | 11/2004 | Wise et al. | |
| 2004/0264696 A1 | 12/2004 | Cockburn et al. | |
| 2005/0128109 A1 | 6/2005 | Sane et al. | |
| 2005/0169364 A1 | 8/2005 | Singh | |
| 2006/0291560 A1 | 12/2006 | Penna et al. | |
| 2007/0113222 A1 | 5/2007 | Diqnum et al. | |
| 2007/0174588 A1 | 7/2007 | Fuin | |
| 2008/0022074 A1 | 1/2008 | Madduri | |
| 2008/0198047 A1 | 8/2008 | Niemi et al. | |
| 2008/0232461 A1 | 9/2008 | Dachiku | |
| 2009/0006510 A1 | 1/2009 | Laker et al. | |
| 2009/0089507 A1* | 4/2009 | Chen | G06F 8/433 |
| | | | 711/125 |
| 2009/0220009 A1 | 9/2009 | Tomita et al. | |
| 2010/0020825 A1 | 1/2010 | Bass et al. | |
| 2010/0141488 A1 | 6/2010 | Baktir et al. | |
| 2011/0060927 A1* | 3/2011 | Fillingim | G11C 5/141 |
| | | | 713/320 |
| 2011/0208833 A1 | 8/2011 | Fallon | |
| 2011/0280314 A1 | 11/2011 | Sankaran et al. | |
| 2013/0103695 A1 | 4/2013 | Rarrick et al. | |
| 2013/0147644 A1 | 6/2013 | Agarwal | |
| 2013/0148745 A1 | 6/2013 | Agarwal | |

OTHER PUBLICATIONS

Office Action for U.S. Appl. No. 13/313,072, U.S. Patent and Trademark Office, mailed Dec. 31, 2013, 16 pages.

Office Action for U.S. Appl. No. 13/555,547, U.S. Patent and Trademark Office, mailed Jun. 4, 2013, 14 pages.

Notice of Allowance for U.S. Appl. No. 13/555,547, U.S. Patent and Trademark Office, mailed Jan. 2, 2014, 14 pages.

Deutsch, "DEFLATE Compressed Data Format Specification version 1.3," Network Working Group RFC 1951, May 1996, 25 pages.

Lee et al., "Token-Ring Reservation Enhancer for Early Token Release," IBM Technical Disclosure Bulletin, vol. 33, No. 7, IPCOMM000102647D, Dec. 1, 1990, 6 pages.

Moertl et al., "Direct Access Storage Device Compression and Decompression Data Flow," IBM Technical Disclosure Bulletin, vol. 38, No. 11, IPCOM000116855D, Nov. 1, 1995, 5 pages.

Blanco et al., "Dynamic Random Access Memory Refresh Method in Triple-Modular-Redundant System," IBM Technical Disclosure Bulletin, Jul. 1, 1993, vol. 36, No. 07, pp. 7-12.

Burger et al., "A Session Initiation Protocol (SIP) Event Package for Key Press Stimulus (KPML)," Internet Society, Standards Track, Request for Comments 4730, Nov. 1, 2006, 58 pages.

Notice of Allowance for U.S. Appl. No. 14/012,452, U.S. Patent and Trademark Office, mailed Aug. 21, 2014, 17 pages.

Surtees et al., "Signaling Compression (SigComp) User's Guide," Internet Society, ip.com, IPCOM000136745D, May 1, 2006, 45 pages.

ASPRS Board, "LAS Specification Version 1.2," ASPRS Board Meeting, Sep. 2, 2008, 13 pages.

Pereira, "IP Payload Compression Using DEFLATE," Internet Society, ip.com, IPCOM000002967D, Dec. 1, 1998, 6 pages.

Deutsch et al, "ZLIB Compressed Data Format Specification Version 3.3," Internet Society, ip.com, IPCOM000004248D, May 1, 1996, 13 pages.

* cited by examiner

| Context State Data 185 | | | | |
|---|---|---|---|---|
| COMMIT INDICATOR | EOB INDICATOR | OUTPUT BYTES VALUE | INPUT BITS VALUE | HEADER SIZE |
| Indicates New Commit Point | Indicates Commit Point Corresponds to End of Block | Indicates # of Bytes in Output Word Corresponding to Commit Point | Indicates # of bits in Input Stream Corresponding to Commit Point | Total Size of Current Block Header (including Huffman Tree) |
| 400 | 410 | 420 | 430 | 440 |

*FIG. 4A*

| Context State Store Entry 450 | | | | |
|---|---|---|---|---|
| DATA STREAM ID | CUM LOGICAL COMMIT INPUT BITS | CUM EOB COMMIT INPUT BITS | HEADER SIZE | OUTPUT BYTE HISTORY |
| Stream Identifier (e.g., LPAR ID) | Cumulative bits Corr. to Last Logical Commit | Cumulative bits Corr. to Last EOB Commit | Header Size Corr. to Last Commit | Previously Committed Output Bytes (DMA Pointer) |
| 460 | 465 | 470 | 475 | 480 |

*FIG. 4B*

EFFICIENT CONTEXT SAVE/RESTORE DURING HARDWARE DECOMPRESSION OF DEFLATE ENCODED DATA

BACKGROUND

The present disclosure relates to efficient context save/restore during hardware decompression of deflate encoded data. More particularly, the present disclose relates to using mid-stream restore commit points to efficiently restore a data stream that was interrupted during a previous decompression session.

Computer systems compress data for various reasons, such as to reduce storage requirements or to reduce bandwidth requirements when sending data over a computer network. One approach to compress data is referred to as "DEFLATE". Deflate is a data compression algorithm that uses a combination of an LZ77 algorithm and Huffman coding to compress data. Deflate data streams include a series of "deflate blocks," which includes a header, Huffman encoded deflate elements, and an Huffman encoded end of block element. A particular deflate block's header includes information to configure a decompression engine such that the decompression engine correctly decompresses each Huffman element in the particular deflate block. As a result, for each deflate block, the decompression engine is reconfigured based upon the header of the deflate block. The deflate blocks may be static deflate blocks (use static Huffman encoding), dynamic deflate blocks (includes a Huffman tree in the header), or non-compressed blocks with varying sizes.

BRIEF SUMMARY

According to one embodiment of the present disclosure, an approach is provided in which a hardware accelerator receives a request to decompress a data stream that includes multiple deflate blocks and multiple deflate elements compressed according to block-specific compression configuration information. The hardware accelerator identifies a commit point that is based upon an interruption of a first decompression session of the data stream and corresponds to one of the deflate blocks. As such, the hardware accelerator configures a decompression engine based upon the corresponding deflate block's configuration information and, in turn, recommences decompression of the data stream at an input bit location corresponding to the commit point.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein:

FIG. 4A is a diagram showing an example of context state data 185 that is generated by a decompression engine when decompressing a data stream;

FIG. 4B is a diagram showing an example of context state data that is managed by a decompression interface and utilized to restore data stream decompression at a point in proximity to where a previous data stream decompression session was interrupted;

DETAILED DESCRIPTION

Figure 1:
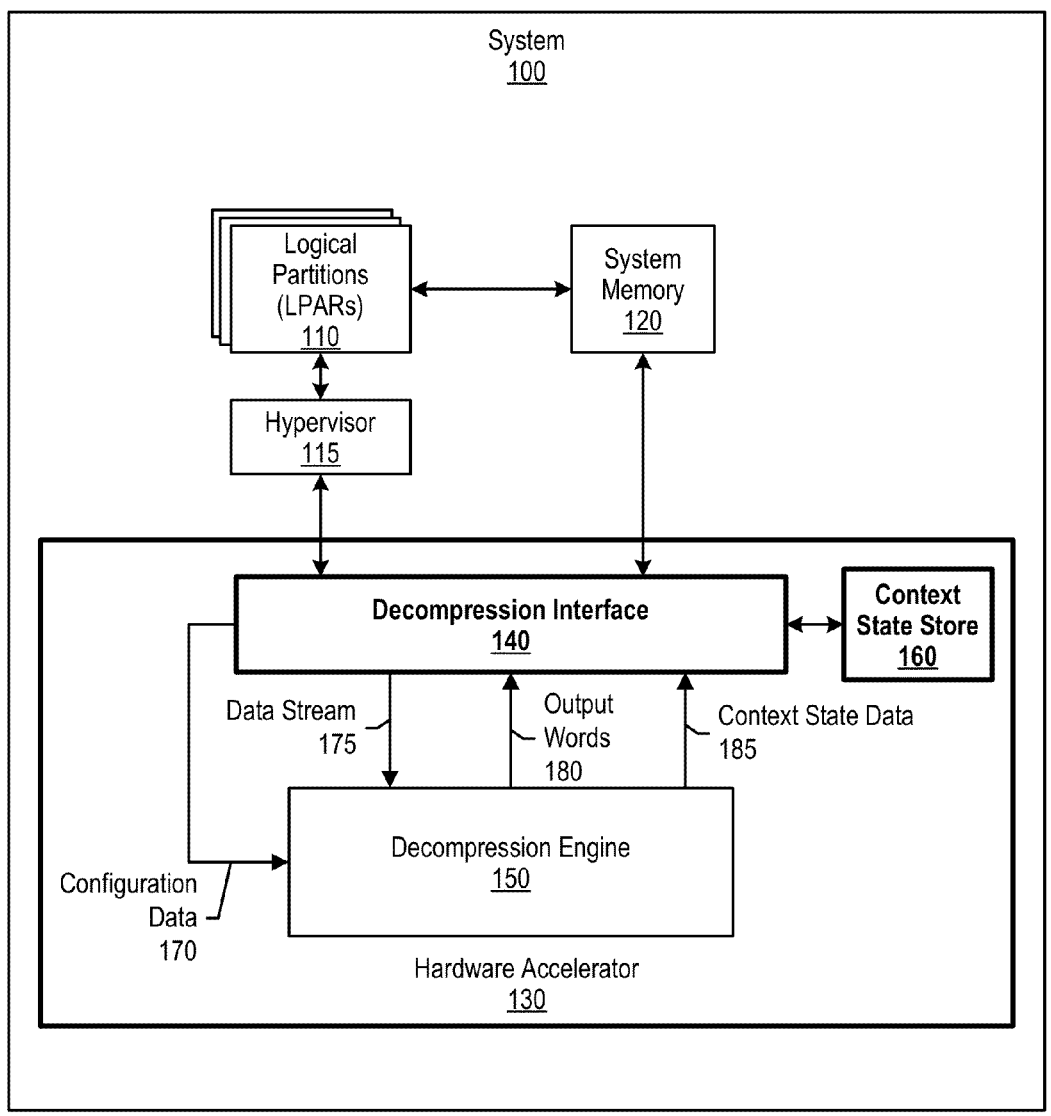
FIG. 1 is a diagram showing an example of a system that includes a hardware accelerator with context save/restore functionality to decompress multiple data streams that were decompressed using a deflate compression technique.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The following detailed description will generally follow the summary of the disclosure, as set forth above, further explaining and expanding the definitions of the various aspects and embodiments of the disclosure as necessary.

FIG. 1 is a diagram showing an example of a system that includes a hardware accelerator with context save/restore functionality to decompress multiple data streams that were compressed using a deflate compression technique. System 100 includes hardware accelerator 130, which receives instructions from hypervisor 115 to decompress data stream 175 corresponding to one or more of logical partitions (LPARs) 110.

In one embodiment, hypervisor 115 instructs hardware accelerator 130 to stop decompressing a first data stream in order to decompress a second data stream from a different LPAR (e.g., with a higher priority), and then recommence decompression of the first data stream at a later time. When hardware accelerator 130 recommences decompression of the first data stream, hardware accelerator 130 loads saved context state data (saved during the first decompression session in context state store 160) and recommences decompression of the first data stream in proximity to the point at which hardware accelerator 130 stopped the first decompression session (discussed in detail below). As such, hardware accelerator 130 is not required to start recommencing data stream decompression at the beginning of the first data stream.

Hardware accelerator 130 includes decompression interface 140 and decompression engine 150, which may be separate hardware modules or included in a single hardware module. Decompression interface 140 interfaces to hypervisor 115 and receives decompression commands to decompress a particular data stream. Decompression interface 140 sends a compressed data stream 175 to decompression engine 150 that, in turn, decompresses deflate blocks included in data stream 175 accordingly. As those skilled in the art can appreciate, deflate blocks may be static Huffman blocks, dynamic Huffman blocks, or non-compressed data blocks. As those skilled in the art can also appreciate, each deflate block includes a header, deflate elements (Literal elements and/or pointer elements), and an end of block element (see FIG. 3 and corresponding text for further details).

While decompressing data stream 175, decompression engine 150 includes decompressed output bytes in output words 180, which are sent to decompression interface 140. In addition, decompression engine 150 tracks commit points corresponding to "committed" deflate elements. Committed deflate elements are elements whose symbols have been decoded and their corresponding output bytes have been committed to output words 180 (see FIG. 3 and corresponding text for further details). As those skilled in the art can appreciate, deflate literal elements include one Huffman symbol and deflate pointer elements include two Huffman symbols (one for Length encoding and one for backward distance encoding).

Decompression engine 150 includes information corresponding to the "commit points" in context state data 185, which decompression interface 140 stores in context state store 160 for later restoration if hardware accelerator 130 is interrupted prior to completing the decompression of the data stream (e.g., to decompress a higher priority data stream) (see FIGS. 2, 4A, 4B, and corresponding text for further details). When hardware accelerator 130 receives instructions to recommence decompressing the partially decompressed data stream, decompression engine 140 retrieves context state data from context state store 160 and configures decompression engine 150 (via configuration data 170 such as reloading block-specific compression configuration information corresponding to the header (and Huffman tree if applicable)) to recommence decompression of the data stream at a point in proximity to decompression engine 150's previous interruption point.

Figure 2:
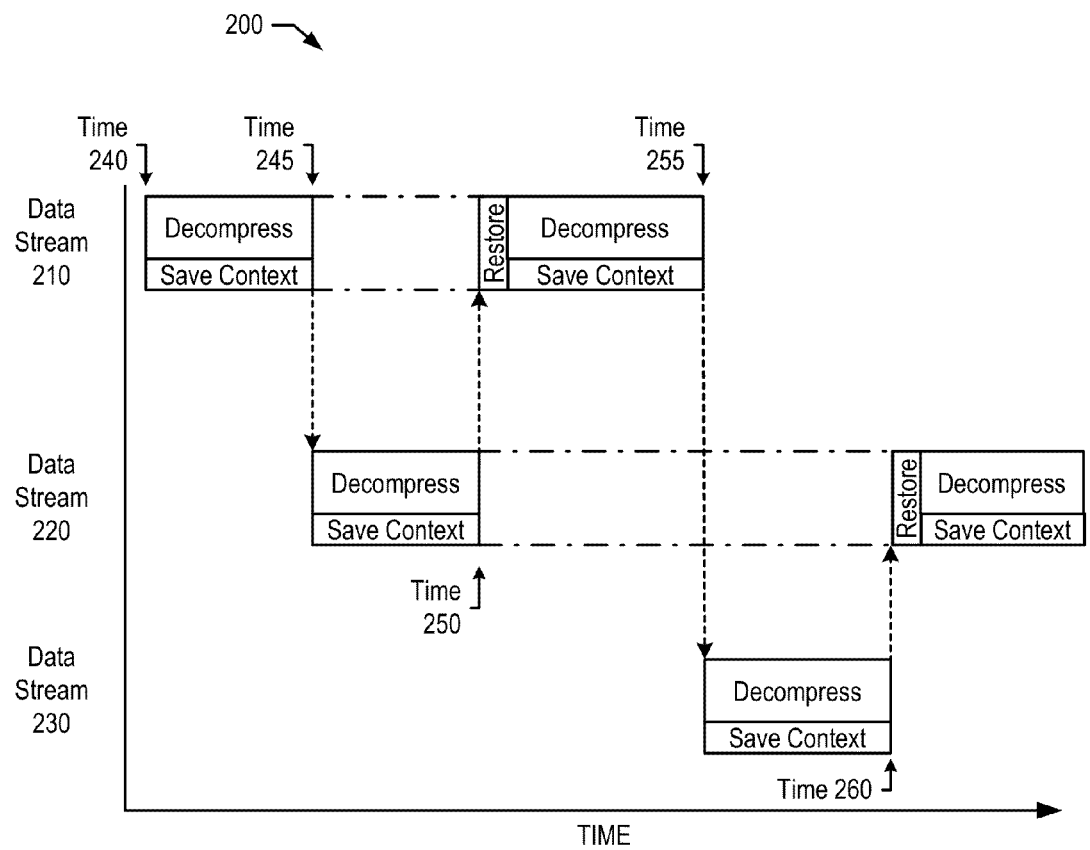
FIG. 2 is a diagram showing a timeline of multiple data streams being decompressed.

FIG. 2 is a diagram showing a timeline of multiple data streams being decompressed. Graph 200 shows data streams 210, 220, and 230 being decompressed by hardware accelerator 130 in "sessions" based upon decompression commands received from hypervisor 115. Each of data streams 210, 220, and 230 may originate from different logical partitions 110 or from the same logical partition that executes multiple instances of an application.

At time 240, hardware accelerator 130 begins decompressing data stream 210 while also saving context data corresponding to the decompression progress (e.g., identifying commit points corresponding to committed deflate elements). At time 245, hypervisor 115 instructs hardware accelerator 130 to stop decompressing data stream 210 and start decompressing data stream 220. At this point hardware accelerator 130 has stored the latest context state information pertaining to data stream 210's decompression progress.

Hardware accelerator 130 begins decompressing data stream 220 and saving context state data corresponding to the progress of the decompression of data stream 220. At time 250, hypervisor 115 instructs hardware accelerator 130 to recommence decompressing data stream 210. As such, hardware accelerator 130 retrieves the context state data of data stream 210 saved just prior to time 245 and restores data stream 210's context state. In one embodiment, this includes reloading block-specific compression configuration information included in the header (and tree) of a particular deflate block, and may also include reloading up to 32 KB of output bytes (to support upcoming deflate elements that include pointer symbols). Hardware accelerator 130 decompresses data stream 210 while continuing to save context data corresponding to the progress of the decompression between times 250 and 255.

At time 255, hypervisor 115 instructs hardware accelerator 130 to begin decompressing data stream 230. Since data stream 230 has not begun a decompression session up to this point, hardware accelerator 130 begins decompression at the beginning of data stream 230 and saves context data corresponding to data stream 230's decompression progress.

At time 260, hypervisor 115 instructs hardware accelerator 130 to recommence decompressing data stream 220. As such, hardware accelerator 130 retrieves the context state data of data stream 220 saved just prior to time 250 and restores data stream 220's context state. In turn, hardware accelerator 130 decompresses data stream 220 and saves context data corresponding to the progress of the decompression of data stream 220 until data stream 220 is fully decompressed or hardware accelerator 130 receives an instruction from hypervisor 115 to start decompressing a different data stream.

Figure 3:
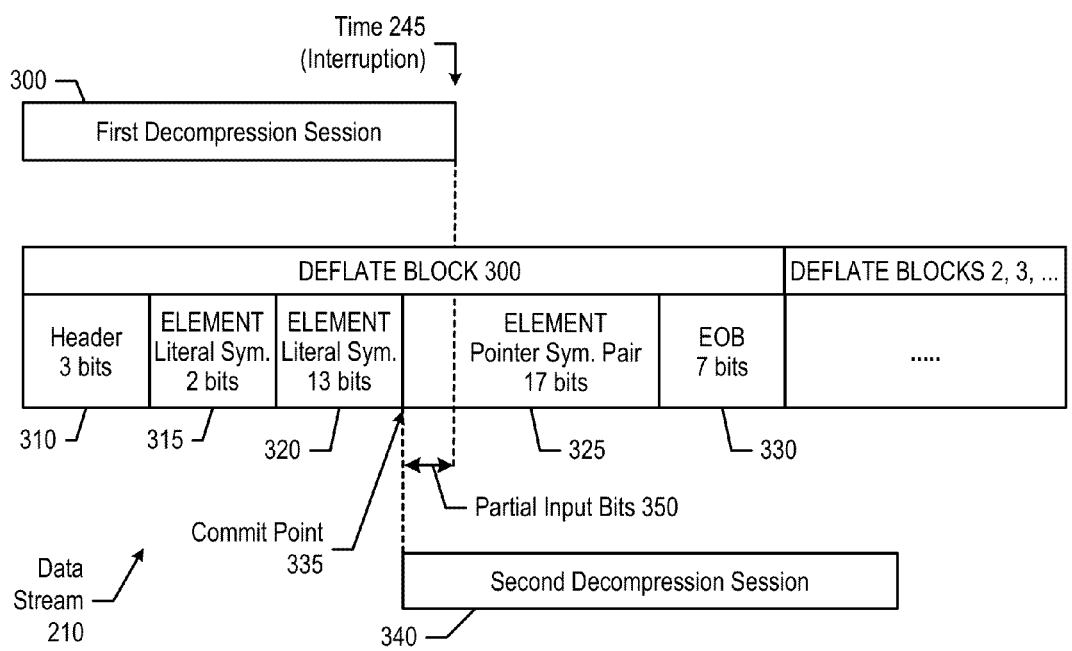
FIG. 3 is a diagram showing an example of a hardware accelerator restarting decompression of a data stream at a commit point.

FIG. 3 is a diagram showing an example of a hardware accelerator restarting decompression of a data stream at a commit point. Data stream 210 includes deflate block 300 and subsequent deflate blocks. Each deflate block includes a header; deflate elements, and an end of block element. As those skilled in the art can appreciate, deflate elements may include literal symbols or pointer symbol pairs.

During hardware accelerator 130's decompression session 300, hardware accelerator 130 receives deflate block header 310, deflate elements 315-320, and only a portion of element 325 until hardware accelerator 130 receives an instruction from hypervisor 115 to stop decompression (time 245 shown in FIG. 2). Hardware accelerator 130 decodes header 310 and decompresses deflate elements 315-320 and commits their corresponding output bytes to output words (e.g., system memory 120). Since hardware accelerator 130's last deflate element that was fully decompressed (decoded and corresponding output bytes committed to output words) is deflate element 320, hardware accelerator 130 "identifies" commit point 335 at the location shown in FIG. 3. In turn, hardware accelerator 130 sets a commit indicator in context state data paired to the output word including the final output byte corresponding to deflate element 320 (see FIGS. 5, 6, and corresponding text for further details).

As such, when hardware accelerator 130 begins a second decompression session (time 250 shown in FIG. 2), hardware accelerator 130 reloads block-specific compression configuration information corresponding to header 310 to configure decompression engine 150, and starts decompressing input stream 210 at commit point 335. FIG. 3 shows that as a result, a small amount of "partial input bits" (350) are processed twice. These bits are reprocessed (along with other input bits) on the second decompression session to produce output bytes corresponding to deflate element 325.

FIG. 4A is a diagram showing an example of context state data 185 that is generated by decompression engine 150 when decompressing data stream 175. Decompression engine 150 generates a set of context state data 185 and an output word 180 in pairs (see FIGS. 5, 6, and corresponding text for further details). The example shown in FIG. 4A shows context state data types 400-440, although those skilled in the art understand that decompression engine 150 may generate more or less context state data types than what is shown in FIG. 4A.

Commit indicator 400 indicates whether a paired output word includes an output byte corresponding to a committed deflate element that, as discussed herein, is a deflate element with fully decoded and processed symbols whose final output byte produced by the deflate element is included in the output word. End of block indicator 410 indicates whether the commit indicator is at the end of a deflate block (e.g., the committed deflate element is the last deflate element in deflate block). Decompression engine 150 makes this determination by detecting the deflate block's end of block element.

Output bytes value 420 indicates the number of output bytes in a corresponding output word that correspond to the commit indicator. For example, the output word may include twelve output bytes from a committed deflate element, and four bytes from a partially processed deflate element. In this example, the output bytes value is twelve. If the output word does not include the final output byte produced by full decoding of one of the deflate elements, the paired context state data will have its commit indicator signal low and the paired context data will not include a valid output bytes value. For example, assuming a deflate element produces 18 output bytes. In this example, the first output word includes 16 output bytes but the paired context state data does not indicate a commit point. The second output word, however, includes the remaining 2 output bytes and, as such, the paired context state data indicates a commit point and that the output bytes value is "2."

Input bits value 430 indicates, when the context state data includes a commit indicator, the number of bits in the input stream corresponding to the commit point when the paired output word includes an output byte that concludes committing a deflate element (similar to output bytes value discussed above). Input bits value is the number of input bits between two commit points. For example, if a first commit point is at bit 54 in the input stream and a second commit point is at 64, the committed input bits is 20, which means that 20 input bits were used to generate a particular amount of output bytes corresponding to one or more additional deflate elements that may get fully decoded between the two commit points. Decompression interface 140 uses this number to track the overall data stream restore point by incrementing a cumulative committed input bit number in context state store 160 (see FIG. 4B and corresponding text for further details).

Header size 440 indicates the total size of the header of the deflate block being processed. For dynamic deflate blocks, the total size includes the bits comprising a coding tree (Huffman tree).

FIG. 4B is a diagram showing an example of context state data that is managed by decompression interface 140 and utilized to restore data stream decompression at a point in proximity to where a previous data stream decompression session was interrupted.

Data stream identifier 460 identifies a data stream or corresponding logical partition. Hardware accelerator 130 uses data stream identifiers to determine if a particular data stream has been partially decompressed or is a new data stream to start decompression from the beginning (see FIG. 10 and corresponding text for further details).

Decompression interface 140 uses cumulative logical commit input bits 465 to track the cumulative input bits in the data stream corresponding to the last logical commit point. Decompression interface 140 increments cumulative logical commit input bits 465 (via input bits value 430) each time it receives context state data that indicates a new commit point. Decompression interface 140 resets cumulative logical commit input bits 465 when it receives context state data that indicates an end of block (see FIG. 8 and corresponding text for further details).

Decompression interface 140 uses cumulative end of block commit input bits 470 to track the cumulative input bits corresponding to the last end of block commit. Decompression interface 140 increments cumulative end of block commit input bits 470 each time it receives context state data that indicates a new end of block by an amount equal to the current logical commit input bits value 465 plus the amount of input bits value 430 included in the last context state data that includes the end of block indicator. In other words, cumulative end of block commit input bits 470 includes all bits until the last end of block commit, and cumulative logical commit input bits 465 includes all committed bits in the current block before an end of block commit indicator is encountered, at which point the value is reset.

Header size 475 includes the header size of the deflate block corresponding to the last commit. In turn, hardware accelerator 130 uses this number to reload the current deflate block's header, or hardware accelerator 130 may fetch the header from system memory (e.g., a software driver manages the state and provides the correct memory pointers to hardware accelerator 130 on a re-start for hardware accelerator 130 to DMA the header).

Output byte history 480 identifies previously committed output bytes that may be required to be reloaded during a restore function in order to support deflate pointer symbols referencing prior output bytes. Output byte history 480 may include the output bytes or may include a pointer to system memory 120 corresponding to a location of the stored output bytes.

Figure 5:
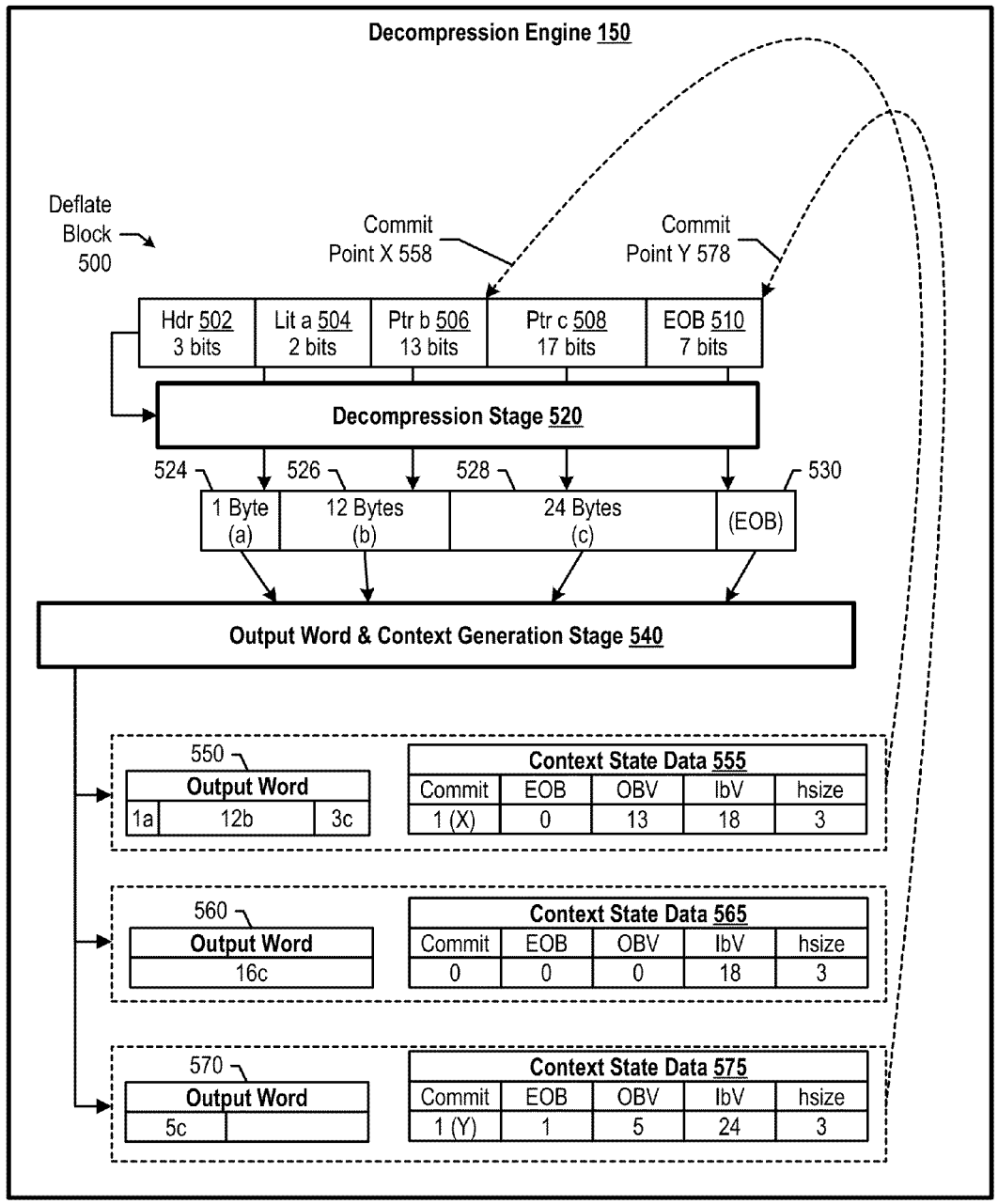
FIG. 5 is a diagram showing an example of a decompression engine decoding a deflate block included in a data stream and generating output words and context state data pairs.

FIG. 5 is a diagram showing an example of decompression engine 150 decoding a deflate block included in a data stream and generating output words and context state data pairs. Hardware accelerator 130's decompression engine 150 includes decompression stage 520 and output word and context generation stage 540.

When decompression engine 150 receives deflate block 500 via data stream 175, decompression engine 150 configures decompression stage 520 via block-specific compression configuration information included in header 502. In one embodiment, header 502 includes a bit indicating whether deflate block 500 is the last block in data stream 175, and two bits indicating an encoding method for the corresponding block (static Huffman compressed data block using a pre-agreed Huffman tree, a dynamic Huffman compressed data block, or a non-compressed block).

Once decompression stage 520 is configured, decompression stage 520 decodes deflate element 504 (literal "a" symbol) into output byte 524 (one byte); decodes deflate element 506 (pointer "b" consisting of length/distance symbol pairs) into output bytes 526 (12 bytes); decodes deflate element 508 (pointer "c" consisting of length/distance symbol pairs) into output bytes 528 (24 bytes); and decodes end of block element 510 into an end of block symbol.

In turn, output word and context generation stage 540 inserts output bytes 524-528 into sixteen byte words and also generates corresponding context state data. The first output word (550) includes output byte 524 (1 "a" byte corresponding to literal deflate element 504), output bytes 526 (12 "b" bytes corresponding to pointer deflate element 506), and three bytes of the 24 "c" output bytes 528 corresponding to pointer deflate element 508. As such, since output word 550 includes output bytes corresponding to fully decoded symbols included in deflate element 506 (now a committed deflate element), output word and context generation stage 540 sets a commit indicator in paired context state data 555. Commit point X 558 provides a visual representation of the commit point corresponding to deflate element 506 once committed. As can be seen, context state data 555 includes an output bytes value of 13 to correspond with commit point X 558 (1 "a" byte plus 12 "b" bytes). Context state data 555 also includes an input bits value of 18 (3 header bits, 2 literal "a" bits, and 13 pointer "b" bits), and a header size of 3 (3 bits).

The next output word and context state pair that output word and context generation state 540 generates is output word 560 and context state data 565. Output word 560 includes 16 more "c" bytes of output bytes 528. Since output word 560 does not include all of the remaining output bytes corresponding to deflate element 508 (e.g., 5 output bytes remain to be committed to an output word), paired context state data 565 does not indicate a new commit point and, as such, does not include a output byte value. In one embodiment, the hardware accelerator is configured to process output words on a full "deflate element basis" (process and commit all output bytes of a deflate element prior to stopping an input stream decompression session). In this embodiment, the hardware accelerator sends output bytes to system memory 120 that do not yet correspond to a commit point because a corresponding commit point will follow in a subsequent output word (discussed below and see FIG. 8 and corresponding text for further details). In another embodiment, decompression interface 140 stores the 16 output bytes included in output word 560 in a temporary memory until decompression engine sends the remaining 5 output bytes corresponding to the deflate element.

The last output word and context state pair that output word and context generation state 570 generates to complete block 500 is output word 570 and context state data 575. Output word 570 includes the last 5 "c" output bytes of output bytes 528, thus committing deflate element 508. As such, output word and context generation stage 540 indicates a new commit point in context state data 575.

In addition, output word and context generation stage 540 identifies end of block symbol 530 as the end of deflate block 500, thus setting the end of block indicator in context state data 575. As a result, the new commit point is set after end of block 510 (commit point Y 578). Context state data 575 includes an output bytes value of 5 to correspond with the 5 bytes included in output word 570. Context state data 575 also includes a committed input bits of 24, which are the number of bits between the last commit (commit point X 558) and the current commit point (commit point Y 578) (17 pointer c bits plus 7 EOB bits).

Figure 6:
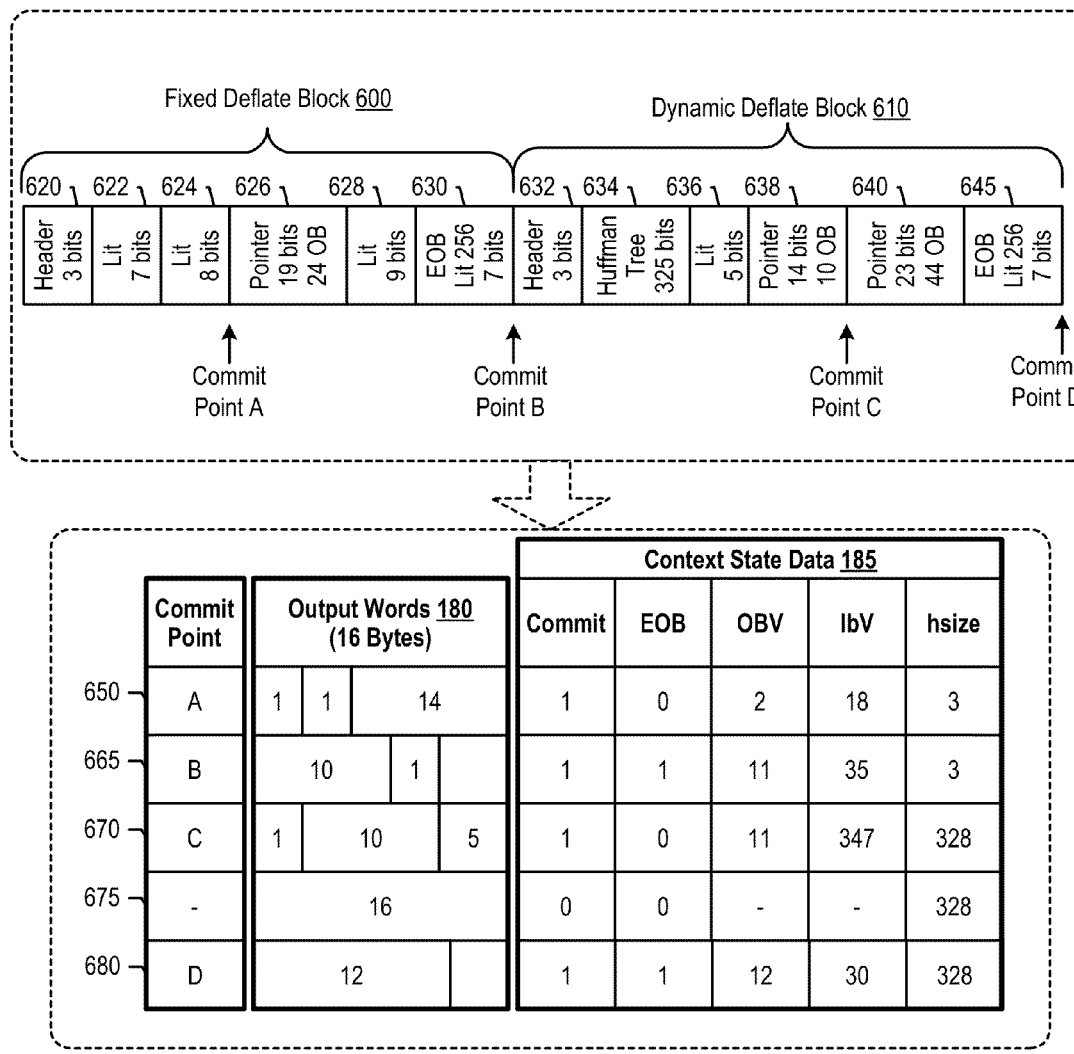
FIG. 6 is a diagram showing an example of decompressing a fixed-sized deflate block and a dynamic-sized deflate block included in a data stream.

FIG. 6 is a diagram showing an example of decompressing a fixed-sized deflate block and a dynamic-sized deflate block included in data stream 175. In one embodiment, each deflate block is preceded by a 3-bit header that includes a bit indicating a last-block-in-stream marker, two bits indicating an encoding method for the corresponding block (static Huffman compressed data block using a pre-agreed Huffman tree, a dynamic Huffman compressed data block, or a non-compressed block). Dynamic deflate data blocks (610) also include a specific decoding tree (Huffman tree 634) to configure decompression engine 150 and correctly decompress the specific dynamic deflate data block.

FIG. 6 shows fixed deflate block 600 (e.g., a fixed Huffman block) and dynamic deflate block 610 (e.g., a dynamic Huffman block). As decompression engine 150 decompresses deflate data blocks 600 and 610, hardware accelerator 150 generates output words 180 and context state data 185 pairs. The first pair of output words and context state data 185 (650) covers deflate element 622 (1 output byte), deflate element 624 (1 output byte), and 14 out of deflate element 626's output bytes. As such, decompression engine 150 identifies a commit point (commit point A), which corresponds to committed deflate elements 622 and 624. Therefore, the first set of context state data 185 sets the commit indicator; has an output byte value of 2 (from deflate elements 622 and 624), has an input bits value of 18 (3+7+8); and a header size of 3 bits (header 620).

The second pair of output words and context state data (665) covers the remaining 10 output bytes from deflate element 626 and one byte from deflate element 628. Since EOB 630 follows deflate element 628, the second output word does not include a full sixteen bytes. In turn, decompression engine 150 identifies a commit point (commit point B), which corresponds to committed deflate symbols 626, 628, and EOB 630. As a result, the second set of context state data 185 sets the commit indicator; sets the end of block indicator; has an output bytes value of 11 (10+1), has an input bits value of 35 (24+9+7); and a header size of 3 bits (header 620).

The third pair of output words and context state data (670) covers deflate elements 636, 638, and portions of deflate element 640 in dynamic deflate block 610. The output word includes 1 output byte from deflate element 636; 10 output bytes from deflate element 638; and five output bytes from deflate element 640 (a portion of the 44 output bytes). As such, hardware accelerator 150 identifies a commit point (commit point C), which corresponds to committed deflate elements 636 and 638. Therefore, the third set of context state data 185 sets the logical commit indicator; has an output byte value of 11 (corresponding to deflate elements 636 and 638); has 347 committed input bits (3 bit header 632+325 bits Huffman tree 634+5 bits symbol 636+14 bits pointer 638); and a header size of 328 bits, which includes bits that comprise Huffman tree 634.

The fourth pair of output words and context state data (675) covers 16 of deflate element 640's output bytes, which brings the total amount of deflate element 640's output bytes committed to output words to 21 (16+5 from output word 670). As such the fourth set of context state data does not set the commit indicator and, in turn, does not include an output bytes value or a an input bits value.

The fifth pair of output words and context state data (680) covers the remaining 12 output bytes from deflate element 640. Since EOB 645 follows deflate element 640, the fifth output word does not include a full sixteen bytes, but rather stops at the end of the block. In turn, decompression engine 150 identifies a commit point (commit point D), which corresponds to committed deflate element 640 and EOB symbol 645. Therefore, the fifth set of context state data 185 sets the commit indicator and the end of block indicator; has an output bytes value of 12, has an input bits value of 30 (23+7); and a header size of 328 bits (header 632 and Huffman tree 634).

Figure 7:
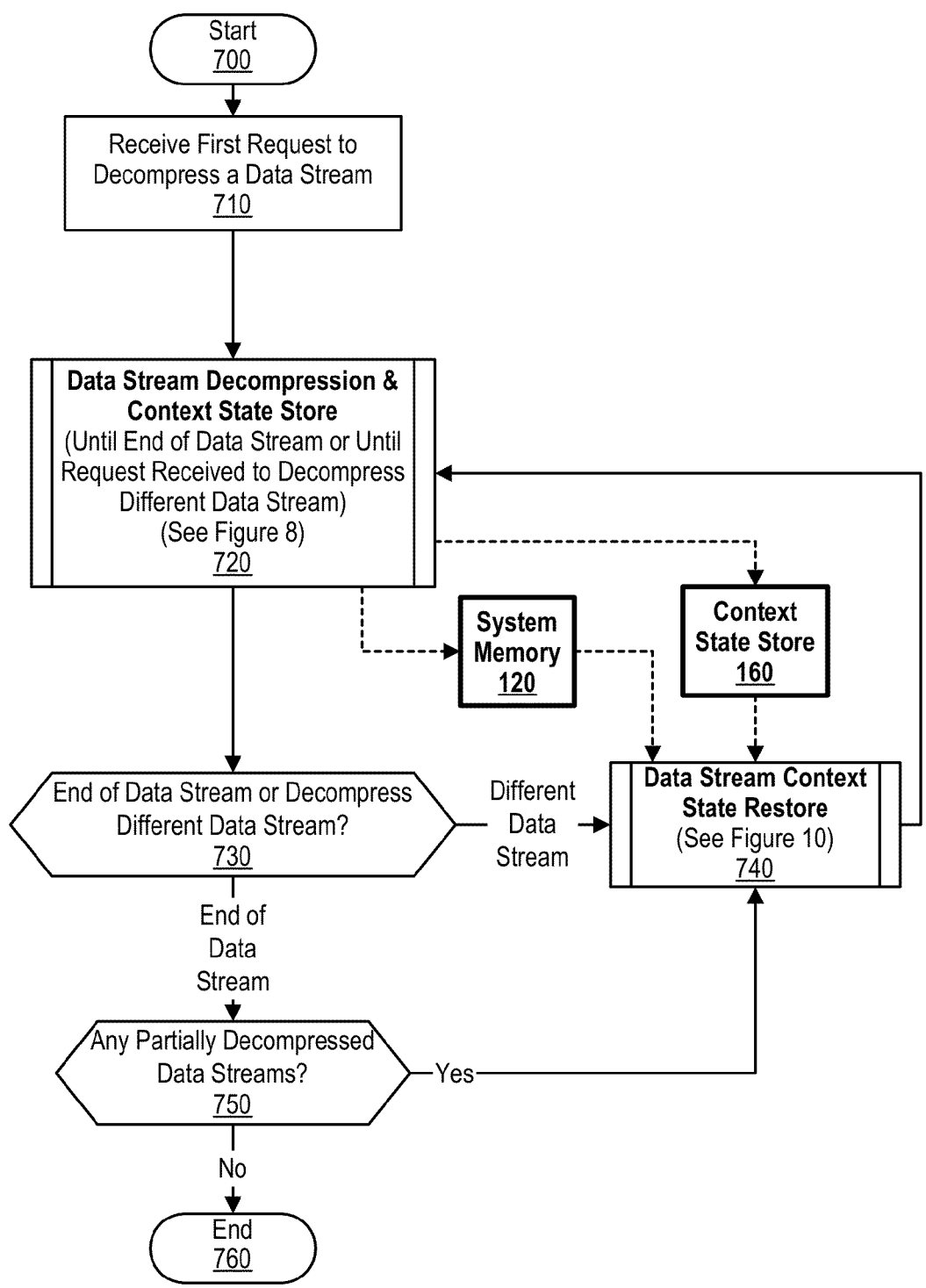
FIG. 7 is a flowchart showing an example of steps taken to save and restore context data while decompressing multiple data streams.

FIG. 7 is a flowchart showing an example of steps taken to save and restore context data while decompressing multiple data streams. Processing commences at 700, whereupon the hardware accelerator receives a first request to decompress a data stream originating from one of LPARs 110. The hardware accelerators begins decompressing the data stream at 720, which includes saving decoded output bytes in system memory 120 and saving context state data in context state store 160 during decompression (see FIG. 8 and corresponding text for further details).

The hardware accelerator continues to decompress the data stream until completion or until the hardware accelerator receives a request from hypervisor 115 to decompress a different data stream originating from a different LPAR (decision 730). If the hardware accelerator is interrupted from decompressing the first data stream and is requested to decompress a second data stream, decision 730 branches to the "Different Data Stream" branch, whereupon the hardware accelerator restores the context data of the second data stream if the hardware accelerator had previously decompressed a portion of the second data stream (pre-defined process block 740, see FIG. 10 and corresponding text for further details). The hardware accelerator, in turn, recommences decompression of the second data stream (720).

Referring back to decision 730, if the hardware accelerator completes decompression of the first input data stream, decision 730 branches to the "end of data stream" branch, whereupon a determination is made as to whether there are any partially decompressed input data streams (decision 750). If the hardware accelerator should recommence decompressing a particular input data stream, decision 750 branches to the "Yes" branch, whereupon the hardware accelerator retrieves the particular data stream's corresponding context state data from context state store 160 and decompresses the input data stream at a location corresponding to the last commit point (740).

On the other hand, if there are no partially decompressed input data streams, decision 750 branches to the "No" branch, whereupon the hardware accelerator ends processing steps at 760.

Figure 8:
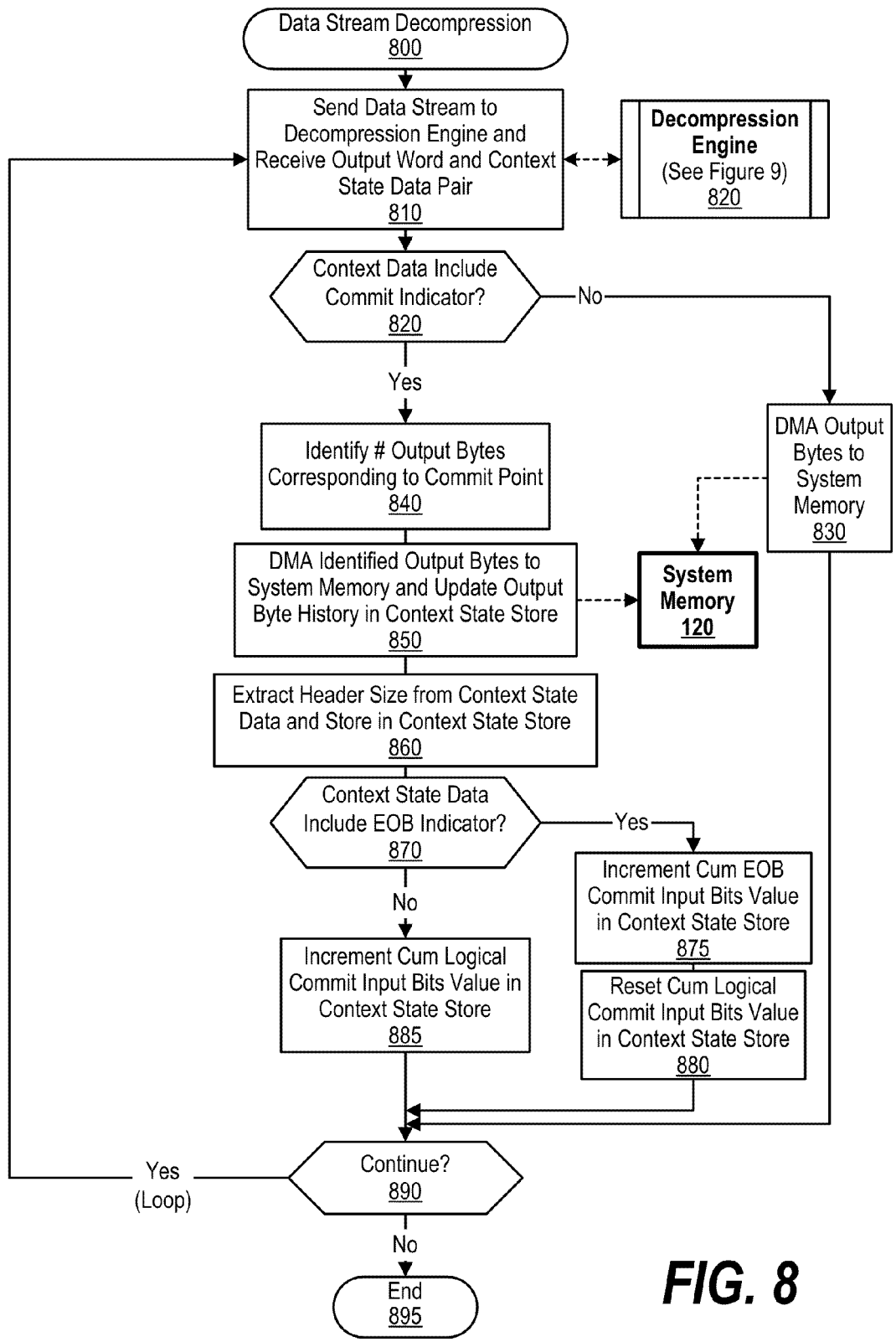
FIG. 8 is flowchart showing an example of steps taken by a hardware accelerator to store context state data while concurrently decompressing a data stream that includes deflate data blocks.

FIG. 8 is flowchart showing an example of steps taken by a hardware accelerator to store context state data while concurrently decompressing a data stream that includes deflate data blocks. Processing commences at 800, whereupon at 810 decompression interface 140 sends a data stream to decompression engine 150 (data stream 175) and receives paired output words 180 and context state data 185.

The hardware accelerator determines whether the context state data includes a commit indicator, such as that shown in FIGS. 4-6 (decision 820). If the context state data does not include a commit indicator, decision 820 branches to the "No" branch, whereupon, in one embodiment, the hardware accelerator sends the output bytes to system memory 120. In this embodiment, the hardware accelerator is configured to process output words on a full "deflate element basis" (process and commit all output bytes corresponding to the last fully received deflate element prior to stopping an input stream decompression session). In this embodiment, the hardware accelerator sends output bytes at 830 to system memory 120 that do not yet correspond to a commit point because a corresponding commit point will follow in a subsequent output word. In another embodiment, the hardware accelerator stores output bytes included in the received output word in a temporary storage area until the remaining output bytes corresponding to the deflate element are received.

On the other hand, if the context state data includes a commit indicator, decision 820 branches to the "Yes" branch. At 840, the hardware accelerator identifies the number of output bytes in the output word corresponding to the commit point. At 850, the hardware accelerator sends the identified output bytes via DMA to system memory 120, and updates output byte history in context state store 160. At 860, the hardware accelerator extracts the header size from the context state data and stores the header size in context state store 160.

In one embodiment, the hardware accelerator saves block-specific compression configuration information included in the header (header bits including Huffman tree for the dynamic block) from the compressed stream corresponding to the current block in its local memory. In another embodiment, a software driver uses the end of block and header size information to extract and save the block-specific compression configuration information in system memory and, in turn, provides a pointer to the hardware accelerator on re-start for the hardware accelerator to DMA the header.

The hardware accelerator determines if the context state data includes an end of block indicator (decision 870). If the context state data includes an end of block indicator, decision 870 branches to the "Yes" branch, whereupon the hardware accelerator increments cumulative end of block commit input bits value 470 in context state store 160 that tracks the number of input bits corresponding to the last end of block commit (875). At 880, the hardware accelerator resets cumulative logical commit input bits value 465 because the hardware accelerator reached an end of block.

Referring back to decision 870, if the context state data does not indicate an end of block, decision 870 branches to the "No" branch, whereupon the hardware accelerator increments cumulative logical commit input bits value 465 by an amount of the input bits value included in the received context state data (885).

The hardware accelerator determines whether to continue decompressing the data stream (decision 890). For example, the hardware accelerator may have finished decompressing the data stream, or the hardware accelerator may have received an interrupt request from hypervisor 115 to start decompressing a different data stream. If the hardware accelerator should continue to decompress the existing data stream, decision 890 branches to the "Yes" branch, whereupon the hardware accelerator continues decompressing the data stream. This looping continues until either the hardware accelerator completes decompression of the current data stream, or receives a request to decompress a different data stream, at which point decision 890 branches to the "No" branch, whereupon the hardware accelerator returns to perform steps shown in FIG. 7.

Figure 9:
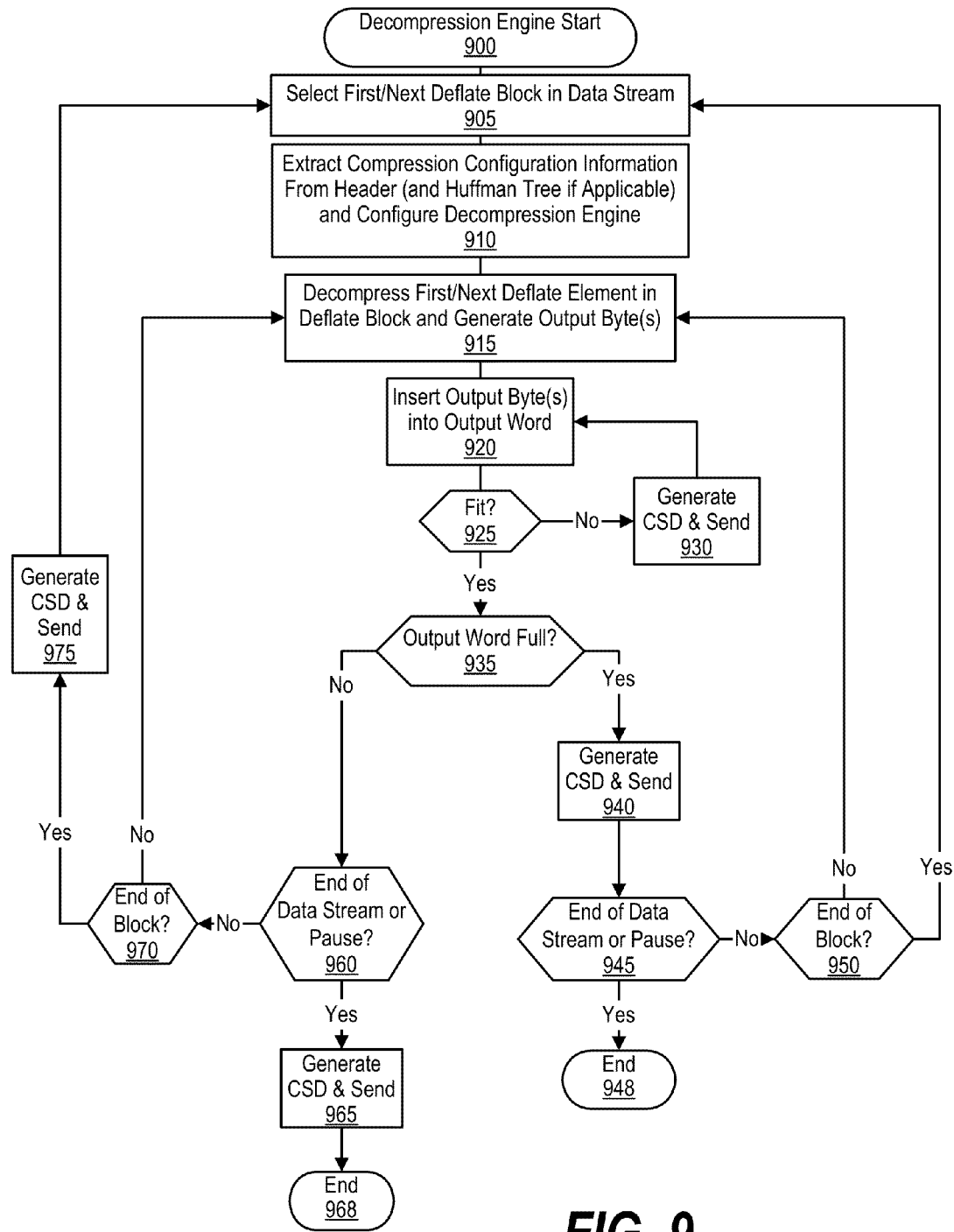
FIG. 9 is a flowchart showing steps taken in a decompression engine decompressing deflate blocks and generating context state data.

FIG. 9 is a flowchart showing steps taken in a decompression engine decompressing deflate blocks and generating context state data. Processing commences at 900, whereupon the decompression engine identifies a deflate block in the data stream at 905. At 910, the decompression engine extracts block-specific compression configuration information from the deflate block's header (and Huffman tree if the deflate block is dynamic), and configures itself to decompress deflate elements within the same deflate block.

The decompression engine decompresses the first deflate element in the deflate block at 915 and generates output bytes accordingly (e.g., from Huffman decoded symbols). At 920, the decompression engine inserts the output bytes into an output word, and a determination is made as to whether all of the generated output bytes fit into the output word (decision 925). For example, assuming an output word is 16 bytes, all of the generated output bytes will fit if the total is 16 bytes or less. If all of the output bytes do not fit (e.g., greater than 17 bytes), decision 925 branches to the "No" branch, whereupon the decompression engine generates context state data corresponding to the output word and sends the context state data/output word pair to the decompression interface (930). Since the output word does not include a final output byte of the deflate element, the context state data does not set commit indicators (e.g., context state data 565 shown in FIG. 5).

On the other hand, if all of the output bytes from the deflate element fit in the output word, decision 925 branches to the "Yes" branch, whereupon a determination is made as to whether the output word is full (decision 935). If the output word is full, decision 935 branches to the "Yes" branch, whereupon the decompression engine generates context state data corresponding to the output word and sends the context state data/output word pair to the decompression interface (940). At this point, since all of the output bytes fit in the output word, the context state data includes a commit indicator (and corresponding output bytes value and input bits value) corresponding to the deflate element. In addition, if the deflate element is the last deflate element in the deflate block, the decompression engine sets the end of block indicator.

A determination is made as to whether the data stream has ended or whether the hardware accelerator received an indication to pause decompression of the data stream (decision 945). If either one is the case, decision 945 branches to the "Yes" branch, whereupon the decompression engine ends decompression of the data stream at 948. On the other hand, if the data stream has not ended and the hardware accelerator has not received an indication to pause decompression of the data stream, decision 945 branches to the "No" branch, whereupon a determination is made as to whether the deflate element was the last deflate element in deflate block (decision 950).

If the deflate element is not the last deflate element in the deflate block, decision 950 branches to the "No" branch, whereupon the decompression engine decompresses the next deflate element (915) based upon the current compression configuration information from the deflate block's header (and Huffman tree if applicable). On the other hand, if the deflate element is the last deflate element in the deflate block, decision 950 branches to the "Yes" branch, whereupon the decompression engine selects the next deflate block in the data stream and configures itself according to the next deflate block's compression configuration information included in the header (and Huffman tree if applicable).

Referring back to decision 935, if the output word is not full, decision 935 branches to the "No" branch, whereupon a determination is made as to whether the data stream has ended or whether the hardware accelerator received an indication to pause decompression of the data stream (decision 960). If either one is the case, decision 960 branches to the "Yes" branch, whereupon the decompression engine generates context state data corresponding to the output word and sends the context state data/output word pair to the decompression interface (965). At this point, the decompression engine sets the commit indicator (and corresponding output bytes value and input bits value) corresponding to the deflate element, and also sets the end of block indicator if at the end of the data stream.

On the other hand, if the data stream has not ended and the hardware accelerator has not received an indication to pause decompression of the data stream, decision 960 branches to the "No" branch, whereupon a determination is made as to whether the deflate element is the last deflate element in the deflate block (decision 970). If the deflate element is not the last deflate element in the deflate block, decision 970 branches to the "No" branch, whereupon the decompression engine decompresses the next deflate element (915) based upon the current compression configuration information from the deflate block's header (and Huffman tree if applicable). On the other hand, if the deflate element is the last deflate element in the deflate block, decision 970 branches to the "Yes" branch, whereupon the decompression engine selects the next deflate block in the data stream and configures itself according to the next deflate block's compression configuration information included in the header (and Huffman tree if applicable).

Figure 10:
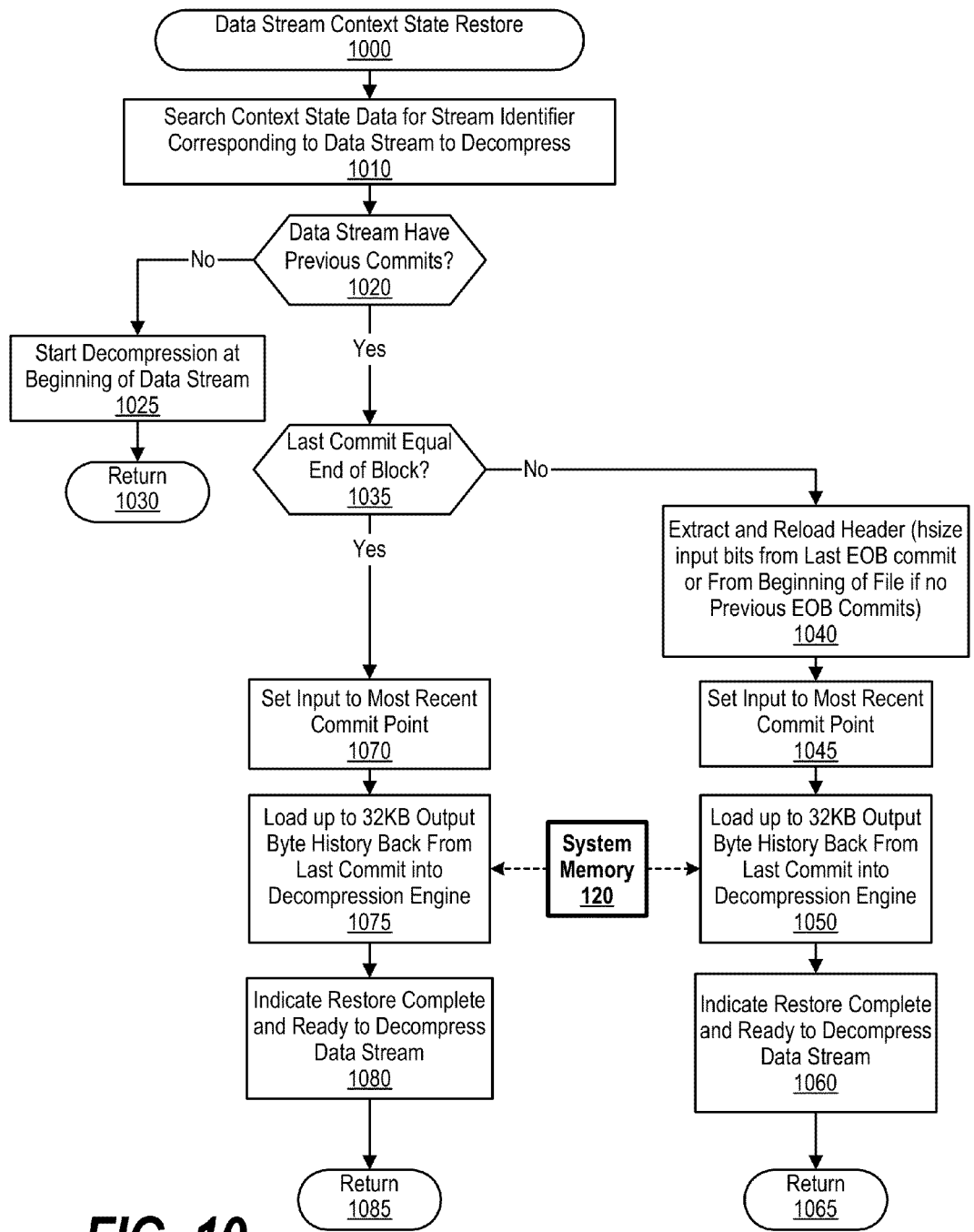
FIG. 10 is flowchart showing an example of steps taken by the hardware accelerator to restore a context state of a partially decompressed data stream.

FIG. 10 is flowchart showing an example of steps taken by the hardware accelerator to restore a context state of a partially decompressed data stream. Processing commences at 1000, whereupon the hardware accelerator searches context state store 160 for context data corresponding to a data stream about to be decompressed (1010). The hardware accelerator determines whether any corresponding context data exists, such as by comparing the input stream's identifier with stream identifiers stored in context state store 160 (see FIG. 4B and corresponding text for further details). If the hardware accelerator does not find a match, decision 1020 branches to the "No" branch, indicating that the input data stream has not started decompression, and the hardware accelerator starts decompressing the input data stream from the beginning (1025) and returns at 1030.

On the other hand, if the hardware accelerator finds stored context state data corresponding to the input data stream, decision 1020 branches to the "Yes" branch, whereupon the hardware accelerator determines whether the last commit point corresponds to an end of block (decision 1035). If the last commit point corresponds to an end of block, the hardware accelerator does not need to reload block-specific compression configuration information corresponding to the header because the decompression will start at the beginning of a new deflate block.

If the last commit point corresponds to an end of block, decision 1035 branches to the "Yes" branch, whereupon the hardware accelerator performs steps 1070-1080 to set a restore point at the next deflate block for decompression. At 1070, the hardware accelerator sets the input start point based upon the cumulative end of block commit input bits value stored in context data store 160. At 1075, the hardware accelerator loads up to 32 kb of previously generated output bytes from system memory 120 (or a local cache). The hardware accelerator performs this step to satisfy deflate decompression requirements when the hardware accelerator receives pointer symbols corresponding to previously decoded deflate elements. The hardware accelerator indicates that the restore is complete at 1080 and returns at 1085 to performs steps in FIG. 7 to commence decompressing the data stream.

On the other hand, if the last commit point does not correspond to an end of block, but rather a logical commit point at a mid-block location, decision 1035 branches to the "No" branch. Since deflate decompression utilizes block-specific compression configuration information to configure decompression engine 150 for proper decompression, the hardware accelerator reloads the block-specific compression configuration information (e.g., from system memory or local memory) into decompression engine 150 at step 1040. In one embodiment, the header information (block-specific compression configuration information) is identified by the header size input bit value included in the context state data corresponding to the last end of block commit. In this embodiment, if no end of block has been committed, indicating that the first block was in process of being decompressed, the hardware accelerator identifies header information from the beginning of the input data stream.

In another embodiment, the hardware accelerator does not perform bit shifts during header re-load. For example, if a header is reloaded that goes from bits 7 to 70 in the input stream and input bit width is 64, the header is reloaded as word-1 bits 0-63, start offset 7, end-offset 64, header-load-signal=1; word-2 bits 64-127, start-offset 0, end-offset 70, header-load-signal=1. In this example, if the last commit was at bit 135, the input starts as word: bits 128-191, start offset 7, etc.

The hardware accelerator performs steps 1045-1060 to set a restore point at the most recent commit point (e.g., a mid-block point). At 1045, the hardware accelerator sets the input start point based upon the cumulative logical commit input bits value and the cumulative end of block commit input bits value stored in context data store 160. For example, if the cumulative end of block commit input bits value is 100 and the cumulative logical input bits value is 42, the hardware accelerator sets the input start point at bit 143.

At 1050, the hardware accelerator loads up to 32 kb of previously generated output bytes from system memory 120 (or a local cache). As discussed above, the hardware accelerator performs this step to satisfy deflate decompression requirements when the hardware accelerator receives pointer symbols corresponding to previously decoded deflate elements. At 1060, the hardware accelerator indicates that the restore is complete (e.g., a signal to hypervisor 115), and returns at 1065 to performs steps in FIG. 7 to commence decompressing the data stream.

Figure 11:
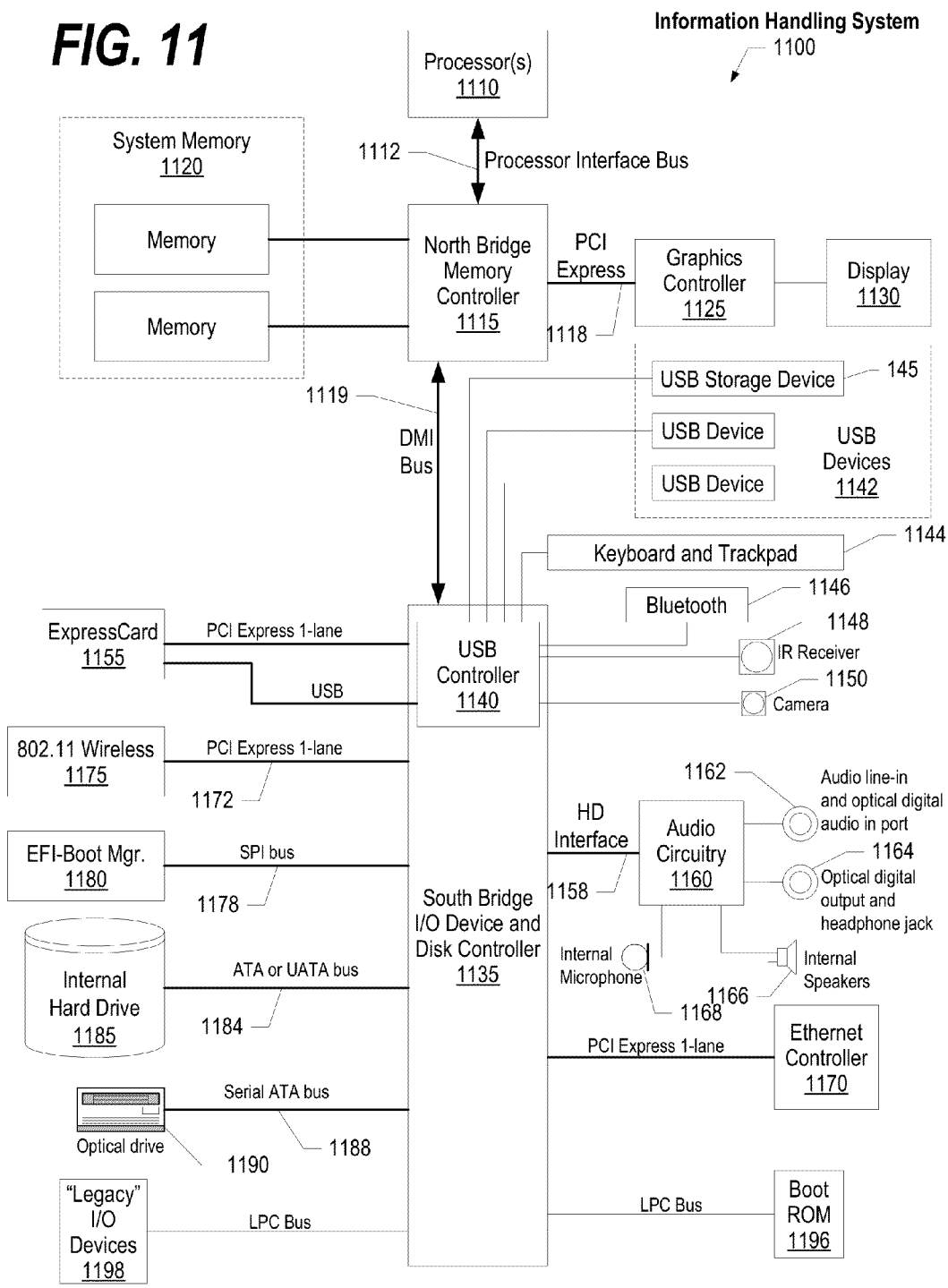
FIG. 11 is a block diagram of a data processing system in which the methods described herein can be implemented.

FIG. 11 illustrates information handling system 1100, which is a simplified example of a computer system capable of performing the computing operations described herein. Information handling system 1100 includes one or more processors 1110 coupled to processor interface bus 1112. Processor interface bus 1112 connects processors 1110 to Northbridge 1115, which is also known as the Memory Controller Hub (MCH). Northbridge 1115 connects to system memory 1120 and provides a means for processor(s) 1110 to access the system memory. Graphics controller 1125 also connects to Northbridge 1115. In one embodiment, PCI Express bus 1118 connects Northbridge 1115 to graphics controller 1125. Graphics controller 1125 connects to display device 1130, such as a computer monitor.

Northbridge 1115 and Southbridge 1135 connect to each other using bus 1119. In one embodiment, the bus is a Direct Media Interface (DMI) bus that transfers data at high speeds in each direction between Northbridge 1115 and Southbridge 1135. In another embodiment, a Peripheral Component Interconnect (PCI) bus connects the Northbridge and the Southbridge. Southbridge 1135, also known as the I/O Controller Hub (ICH) is a chip that generally implements capabilities that operate at slower speeds than the capabilities provided by the Northbridge. Southbridge 1135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 1196 and "legacy" I/O devices (using a "super I/O" chip). The "legacy" I/O devices (1198) can include, for example, serial and parallel ports, keyboard, mouse, and/or a floppy disk controller. The LPC bus also connects Southbridge 1135 to Trusted Platform Module (TPM) 1195. Other components often included in Southbridge 1135 include a Direct Memory Access (DMA) controller, a Programmable Interrupt Controller (PIC), and a storage device controller, which connects Southbridge 1135 to nonvolatile storage device 1185, such as a hard disk drive, using bus 1184.

ExpressCard 1155 is a slot that connects hot-pluggable devices to the information handling system. ExpressCard 1155 supports both PCI Express and USB connectivity as it connects to Southbridge 1135 using both the Universal Serial Bus (USB) the PCI Express bus. Southbridge 1135 includes USB Controller 1140 that provides USB connectivity to devices that connect to the USB. These devices include webcam (camera) 1150, infrared (IR) receiver 1148, keyboard and trackpad 1144, and Bluetooth device 1146, which provides for wireless personal area networks (PANs). USB Controller 1140 also provides USB connectivity to other miscellaneous USB connected devices 1142, such as a mouse, removable nonvolatile storage device 1145, modems, network cards, ISDN connectors, fax, printers, USB hubs, and many other types of USB connected devices. While removable nonvolatile storage device 1145 is shown as a USB-connected device, removable nonvolatile storage device 1145 could be connected using a different interface, such as a Firewire interface, etcetera.

Wireless Local Area Network (LAN) device 1175 connects to Southbridge 1135 via the PCI or PCI Express bus 1172. LAN device 1175 typically implements one of the IEEE 802.11 standards of over-the-air modulation techniques that all use the same protocol to wireless communicate between information handling system 1100 and another computer system or device. Optical storage device 1190 connects to Southbridge 1135 using Serial ATA (SATA) bus 1188. Serial ATA adapters and devices communicate over a high-speed serial link. The Serial ATA bus also connects Southbridge 1135 to other forms of storage devices, such as hard disk drives. Audio circuitry 1160, such as a sound card, connects to Southbridge 1135 via bus 1158. Audio circuitry 1160 also provides functionality such as audio line-in and optical digital audio in port 1162, optical digital output and headphone jack 1164, internal speakers 1166, and internal microphone 1168. Ethernet controller 1170 connects to Southbridge 1135 using a bus, such as the PCI or PCI Express bus. Ethernet controller 1170 connects information handling system 1100 to a computer network, such as a Local Area Network (LAN), the Internet, and other public and private computer networks.

While FIG. 11 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method utilizing an information handling system for resuming decompression of a data stream, the method comprising:
   receiving a request to decompress a data stream that includes a plurality of deflate blocks, wherein each of the plurality of deflate blocks includes block-specific compression configuration information and a plurality of deflate elements compressed according to the block-specific compression configuration information;
   identifying a commit point that is based upon an interruption of a first decompression session of the data stream and corresponds to one of the plurality of deflate blocks, wherein the commit point corresponds to a committed deflate element of the plurality of deflate elements included in a corresponding deflate block that was processed during the first decompression session to generate one or more first output bytes, the processing further comprising:
   inserting one or more of the one or more first output bytes into an output word;
   determining that one of the inserted one or more output bytes is a final one of the one or more first output bytes; and
   generating context state data that indicates the commit point corresponds to the committed deflate element;
   configuring a decompression engine based upon the corresponding deflate block's block-specific compression information; and
   commencing a second decompression session of the data stream, using the configured decompression engine, at an input bit location corresponding to the commit point.

2. The method of claim 1, wherein the plurality of deflate blocks is compressed according to a deflate compression algorithm that includes Huffman encoding, and wherein each of the plurality of deflate blocks is selected from a group consisting of a static deflate block, a dynamic deflate block, and a non-compressed block.

3. The method of claim 1, wherein the configuring of the decompression engine further comprises:
   loading the one or more first output bytes into the decompression engine as output history bytes; and
   using the loaded one or more first output bytes during the second decompression session to generate one or more second output bytes corresponding to one or more subsequent deflate elements that are subsequent to the committed deflate element in the data stream.

4. The method of claim 1, further comprising:
   determining that the committed deflate element is a last deflate element included in the corresponding deflate block; and
   including an end of block indicator in the context state data.

5. The method of claim 1, wherein the data stream corresponds to a first logical partition executing on a host system that interfaces to a hardware accelerator, the method further comprising:
   decompressing the data stream during the first decompression session on the hardware accelerator;
   receiving a different request at the hardware accelerator from the host system to decompress a different data stream corresponding to a second logical partition executing on the host system;
   interrupting the first decompression session at the hardware accelerator in response to the received different request; and
   decompressing the different data stream prior to commencing the second decompression session of the data stream.

6. An information handling system comprising:
   one or more processors;
   a memory coupled to at least one of the processors; and
   a hardware accelerator coupled to at least one of the processors, wherein the hardware accelerator performs a set of actions comprising:
   receiving a request to decompress a data stream that includes a plurality of deflate blocks, wherein each of the plurality of deflate blocks includes block-specific compression configuration information and a plurality of deflate elements compressed according to the block-specific compression configuration information;
   identifying a commit point that is based upon an interruption of a first decompression session of the data stream and corresponds to one of the plurality of deflate blocks, wherein the commit point corresponds to a committed deflate element of the plurality of deflate elements included in a corresponding deflate block that was processed during the first decompression session to generate one or more first output bytes, the processing further comprising:
   inserting one or more of the one or more first output bytes into an output word;
   determining that one of the inserted one or more output bytes is a final one of the one or more first output bytes; and
   generating context state data that indicates the commit point corresponds to the committed deflate element;
   configuring a decompression engine based upon the corresponding deflate block's block-specific compression information; and
   commencing a second decompression session of the data stream, using the configured decompression engine, at an input bit location corresponding to the commit point.

7. The information handling system of claim 6, wherein the plurality of deflate blocks is compressed according to a deflate compression algorithm that includes Huffman encoding, and wherein each of the plurality of deflate blocks is selected from a group consisting of a static deflate block, a dynamic deflate block, and a non-compressed block.

8. The information handling system of claim 6, wherein the set of actions performed by the hardware accelerator further comprise:
   loading the one or more first output bytes into the decompression engine as output history bytes; and
   using the loaded one or more first output bytes during the second decompression session to generate one or more second output bytes corresponding to one or more subsequent deflate elements that are subsequent to the committed deflate element in the data stream.

9. The information handling system of claim 6, wherein the set of actions performed by the hardware accelerator further comprise:
   determining that the committed deflate element is a last deflate element included in the corresponding deflate block; and
   including an end of block indicator in the context state data.

10. The information handling system of claim 6, wherein the data stream corresponds to a first logical partition executing on the information handling system, the set of actions performed by the hardware accelerator further comprising:
    decompressing the data stream during the first decompression session;

receiving a different request from the information handling system to decompress a different data stream corresponding to a second logical partition executing on the host system;

interrupting the first decompression session in response to the received different request; and decompressing the different data stream prior to commencing the second decompression session of the data stream.

11. A computer program product stored in a non-transitory computer readable storage medium, comprising computer program code that, when executed by an information handling system, causes the information handling system to perform actions comprising:

receiving a request to decompress a data stream that includes a plurality of deflate blocks, wherein each of the plurality of deflate blocks includes block-specific compression configuration information and a plurality of deflate elements compressed according to the block-specific compression configuration information;

identifying a commit point that is based upon an interruption of a first decompression session of the data stream and corresponds to one of the plurality of deflate blocks, wherein the commit point corresponds to a committed deflate element of the plurality of deflate elements included in a corresponding deflate block that was processed during the first decompression session to generate one or more first output bytes, the processing further comprising:

inserting one or more of the one or more first output bytes into an output word;

determining that one of the inserted one or more output bytes is a final one of the one or more first output bytes; and generating context state data that indicates the commit point corresponds to the committed deflate element;

configuring a decompression engine based upon the corresponding deflate block's block-specific compression information; and commencing a second decompression session of the data stream, using the configured decompression engine, at an input bit location corresponding to the commit point.

12. The computer program product of claim 11, wherein the information handling system performs further actions comprising:

loading the one or more first output bytes into the decompression engine as output history bytes; and using the loaded one or more first output bytes during the second decompression session to generate one or more second output bytes corresponding to one or more subsequent deflate elements that are subsequent to the committed deflate element in the data stream.

13. The computer program product of claim 11, wherein the information handling system performs further actions comprising:

determining that the committed deflate element is a last deflate element included in the corresponding deflate block; and including an end of block indicator in the context state data.

14. The computer program product of claim 11, wherein the data stream corresponds to a first logical partition executing on the information handling system that interfaces to a hardware accelerator, the information handling system performing further actions comprising:

decompressing the data stream during the first decompression session on the hardware accelerator;

receiving a different request at the hardware accelerator from the information handling system to decompress a different data stream corresponding to a second logical partition executing on the information handling system;

interrupting the first decompression session at the hardware accelerator in response to the received different request; and decompressing the different data stream prior to commencing the second decompression session of the data stream.

* * * * *